(12) United States Patent
Werker et al.

(10) Patent No.: US 10,098,219 B2
(45) Date of Patent: Oct. 9, 2018

(54) PCB CURRENT TRACK COOLING IN ELECTRICAL CLIMATE COMPRESSORS

(71) Applicant: Hanon Systems, Daejeon (KR)

(72) Inventors: Stephan Werker, Merzenich-Golzheim (DE); Holger Gerberich, Erftstadt (DE); Mario Lenz, Kerpen (DE)

(73) Assignee: HANON SYSTEMS, Daejeon (KR)

(*) Notice: Subject to any disclaimer, the term of this patent is extended or adjusted under 35 U.S.C. 154(b) by 0 days.

(21) Appl. No.: 15/217,057

(22) Filed: Jul. 22, 2016

(65) Prior Publication Data

US 2017/0027052 A1    Jan. 26, 2017

(51) Int. Cl.
*H05K 1/02* (2006.01)
*H05K 1/18* (2006.01)
*H05K 7/20* (2006.01)

(52) U.S. Cl.
CPC ......... *H05K 1/0201* (2013.01); *H05K 1/0296* (2013.01); *H05K 1/0203* (2013.01); *H05K 1/181* (2013.01); *H05K 7/20218* (2013.01); *H05K 7/20418* (2013.01); *H05K 2201/064* (2013.01); *H05K 2201/10409* (2013.01)

(58) Field of Classification Search
CPC .... H01L 2023/4062; H01L 2023/4068; H05K 1/0201; H05K 1/0203; H05K 1/0204; H05K 1/0206; H05K 1/0207; H05K 1/0209; H05K 1/021; H05K 1/0212; H05K 1/0272; H05K 1/05; H05K 2201/064; H05K 2201/066; H05K 2201/06; H05K 2201/09054; H05K 2201/09772; H05K 2201/09872; H05K 2201/10416; H05K 3/0061
See application file for complete search history.

(56) References Cited

U.S. PATENT DOCUMENTS

| | | | | |
|---|---|---|---|---|
| 5,157,255 A * | 10/1992 | Kornrumpf | ........... | H01L 25/167 250/252.1 |
| 7,009,318 B2 * | 3/2006 | Iritani | ..................... | F04B 35/04 310/52 |
| 7,308,802 B2 * | 12/2007 | Liu | ....................... | F25D 19/006 257/E23.084 |
| 8,007,255 B2 * | 8/2011 | Hattori | ................. | B60H 1/3223 310/55 |
| 2003/0019234 A1 * | 1/2003 | Wayburn | .................. | G06F 1/20 62/259.2 |
| 2003/0227750 A1 | 12/2003 | Glovatsky et al. | | |

(Continued)

FOREIGN PATENT DOCUMENTS

DE    4335946 A1    4/1995
DE    102014201200 A1    7/2015

(Continued)

*Primary Examiner* — Ishwarbhai B Patel
(74) *Attorney, Agent, or Firm* — Shumaker, Loop & Kendrick, LLP; James D. Miller

(57) ABSTRACT

An assembly and a method for maximizing the current-carrying capacity of conductor tracks and the current-carrying capacity of conductors on or within a circuit board, allows for the use of copper materials, and minimizes the costs of materials and production of the circuit board. The circuit board is connected via a housing with a coolant of a cryogenic device in order to provide heat extraction. The extraction of heat from the circuit board occurs by connecting the circuit board via a housing with a coolant of a cryogenic device.

4 Claims, 2 Drawing Sheets

(56) References Cited

U.S. PATENT DOCUMENTS

2008/0205107 A1 8/2008 Hattori et al.
2008/0310131 A1 12/2008 Fino et al.
2015/0366048 A1* 12/2015 Nagase ............... H01L 23/3735
 174/252

FOREIGN PATENT DOCUMENTS

| JP | 05121605 | 5/1993 |
| JP | 2013106421 A | 5/2013 |
| JP | 2014-150215 A | 8/2014 |

* cited by examiner

PCB CURRENT TRACK COOLING IN ELECTRICAL CLIMATE COMPRESSORS

CROSS-REFERENCE TO RELATED PATENT APPLICATION

This patent application claims priority to German Patent Application No. DE 102015112031.3 filed on Jul. 23, 2015, the disclosure of which is incorporated herein by reference in its entirety.

FIELD OF THE INVENTION

The invention relates to an assembly for improving the current-carrying capacity of conductor tracks, whereby the conductor tracks are arranged on and/or within a circuit board.

The invention, furthermore, relates to a method for improving the current-carrying capacity of conductor tracks, whereby the extraction of heat occurs from the circuit board and the conductor tracks.

BACKGROUND OF THE INVENTION

Circuit boards, also referred to in German as circuit cards, "platins" or printed circuits (English: printed circuit board, PCB) are carriers of electronic components. They allow for mechanical fastening and electrical connection of the components placed on a circuit board in almost all electronic devices.

Such circuit boards for electrical modules must to some extent carry large currents for electric drives or the power supply for a device. One example is a circuit board for operating an inverter for an electrical refrigerating compressor.

To realize a great current-carrying capacity or current-load capacity and improved lateral heat transfer, it is known how to implement conductor tracks, also called conductor paths, on a circuit board with correspondingly great copper-layer thicknesses, e.g., in the 200 to 400 µm range through the use of so-called thick-copper technology.

Alternatively, a so-called inlay technique may be used, with which a solid copper part is pressed into and laminated with the circuit board.

Another option is to apply so-called busbars for carrying current and being arranged outside the circuit board.

Permissible amperages for specified conductor-track widths are provided, e.g., in Directive IPC2221, hereby incorporated herein by reference in its entirety.

The use of broad and thick layered copper conductor tracks, as well as busbars, entails high production and related costs as regards the printed circuit board to be manufactured.

Furthermore, the use of thick copper layers (thick-copper technology) gives rise to limitations in the resolution of conductor gaps (fine pitch). Thus, stricter regimentation must be observed during layout and production of a printed circuit board.

The main reason for the conductor cross-sections mentioned in the IPC2221 Directive is the self-heating of the conductor tracks caused by ohmic resistance. This self-heating can lead to the detachment of the copper interconnects of a carrier material (delamination), as well as the detachment of the individual support materials from one another and the destruction of the circuit board.

SUMMARY OF THE INVENTION

The object of the invention is therefore to identify an arrangement and a method for improving the current-carrying capacity of interconnects, such that the current carrying capacity of interconnects on or within a printed circuit board is maximized and the use of copper materials, as well as the costs of the materials and the manufacture of the printed circuit minimized.

This object is achieved by an arrangement and a method as described herein.

To reduce the conductive cross-sections of interconnects on or within printed circuit boards needed to ensure a predetermined current load, and improve heat extraction, the use of a refrigeration unit located within the structural environment of the circuit board is proposed in order to permanently cool the printed circuit board and allowing for the interconnects to cool down.

With this solution, thermally induced detachment of interconnects and the destruction of components arranged on the printed circuit board are avoided. Moreover, the interconnect cross-sections for the predetermined current load may be reduced, provided the heat can be reliably extracted.

Such active cooling is advantageously achieved by connecting the circuit board with the coolant of a cryogenic device, e.g., an electric refrigerant compressor, such that the generated heat can be reliably extracted.

Electric refrigerant compressors are operated in combination with, e.g., an inverter driving the refrigerant compressor, for which a circuit board with conductor tracks is needed. At least part of the conductor tracks of the printed circuit board must be sufficient for a high current load.

Active cooling of the circuit board and the track conductors in an electrical refrigerating compressor with a flange-mounted inverter is achieved in that the refrigerant compressor is self-cooling as a result of the refrigerant contained therein. Thus, in normal operation, i.e., when the circuit board is energized, part of the compressor housing is cooled by the coolant and thus heat from objects, such as a printed circuit board, can be extracted.

To this end, the circuit board is connected with this compressor housing in an adequately thermally conductive way. It is advantageous to fasten the printed circuit board to the housing of the refrigerant compressor with screws. This threaded connection produces a secure connection between the circuit board and the housing and provides an adequate thermal connection of the circuit board to the housing.

This threaded connection allows for the circuit board to be connected with the housing directly or via a spacer, which should have adequate heat conducting properties.

Likewise, it is advantageous to clamp the circuit board to the housing of the refrigerant compressor, or press it against it. For this purpose, e.g., a part of a second housing may be used, as may a separate support, such as a bracket. Moreover, a spacer may be used for this type of connection of the circuit board with the housing of the refrigerant compressor.

BRIEF DESCRIPTION OF THE DRAWINGS

Further details, features and advantages of the embodiments of the invention are explained in the following description of the exemplary embodiments in reference to the accompanying drawings. The drawings show.

DESCRIPTION OF SPECIFIC EMBODIMENTS

Figure 1:
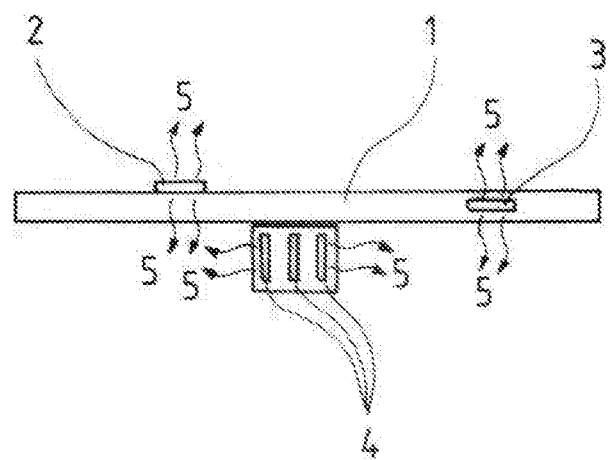
FIG. 1: An illustration of a circuit board with conductor paths arranged on and within the circuit board and a prior-art bus bar.

FIG. 1 shows a circuit board 1 known from the prior art with a first conductor path 2 arranged on the surface of circuit board 1 and a second conductor path 3 introduced into the circuit board 1. Below the circuit board 1, three busbars 4, likewise known from the prior art, are shown. These busbars 4, consisting, e.g., of aluminum or copper, have a matching conductive cross section in order to conduct large currents, e.g., for an electric motor. The first conductor path 2 and/or the second conductor path 3 may likewise be designed for a high current load.

Given the ohmic resistance of the conductor paths 2, 3, which are mostly made of copper, as well as the busbars 4, self-heating of the conductor tracks occurs. The heat 5 emitted from these conductor tracks 2, 3, as well as the busbars 4, is indicated in FIG. 1 by a wavy-line arrow. To avoid excessive heating, especially in the areas of the electroconductive tracks 2, 3 and the busbars 4, and the potential consequences described above, they are implemented with correspondingly large conductive cross-sections.

Figure 2:
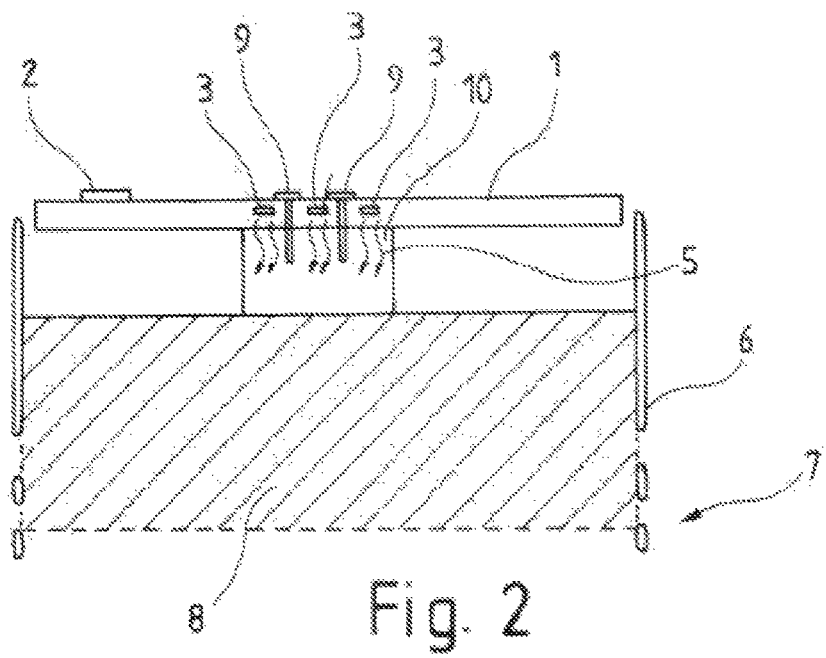
FIG. 2: A first solution according to the invention for cooling of the circuit board by screwing it onto a cooled housing.

FIG. 2 shows a circuit board 1 having a first conductor path 2 on the circuit board 1 and three second conductor paths 3 introduced therein. In order to dissipate the heat 5, the circuit board 1 is connected, at least indirectly, with a housing 6 of a cryogenic device 7, such as a refrigerant compressor 7. The housing 6 encloses, at least partially, a coolant 8 of the refrigerant compressor 7.

To maximize heat extraction, at least the areas of the circuit board 1 through which a high current passes, which in the example of FIG. 2 would be the three second conductor paths 3, are connected in a thermally low impedance way with the housing 6 of the electric refrigerant compressor 7, and are thus better cooled. Due to this cooling, the self-heating of the circuit board 1 is minimized by the current load, and delamination or other damage to the circuit board 1 or the components connected is thus prevented. An adequate thermal connection with a low heat-transfer resistance is considered to be a thermally low-impedance connection. In the exemplary embodiment of the invention in FIG. 2, the connection of the circuit board 1 with the housing 6 of the electric refrigerant compressor 7 is done by means of screws 9 and an elevation 10. The circuit board 1 is fastened with screws 9 to the elevation 10, which is connected, e.g., by a further, not shown, screw connection to the housing 6. Alternatively, the elevation 10 may be welded, glued to, pressed against the housing 6 or already integrated in the housing, i.e., a part of the housing 6 itself.

The invention enables the implementation of these conductor paths 2, 3 with a smaller conductive cross-section by actively cooling the circuit board 1, as well as the conductor paths 2, 3 for the transfer of the same amperages.

Hence, advantages of the invention provide savings of conductor track materials, including savings of production and related costs for the circuit board. Furthermore, a reduction of installation space by saving on bus bars and a reduction of the necessary conductor track widths for the conductor paths 2, 3 are achievable.

FIG. 2 shows a circuit board 1 in another active cooling embodiment, specifically of the three second conductor paths 3 (high current paths). These conductor paths 3 may be, for example, the connections between a half semiconductor bridge and a motor phase in an inverter of an electrical refrigeration compressor 7, although the inverter is not shown in FIG. 2.

A disadvantage of the threaded connection of the circuit board 1 to the elevation 10 by means of screws 9 is a reduction of the width of the effective conductor track caused by the holes that are needed for the screws. 9.

Figure 3:
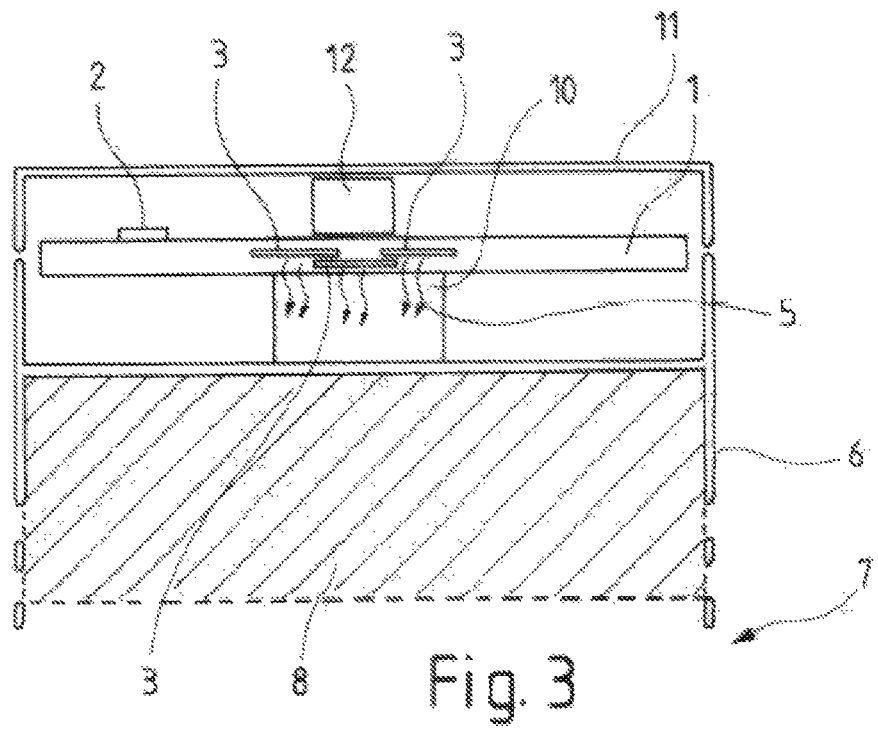
FIG. 3: A second solution according to the invention for cooling the circuit board by pressing the circuit board against a cooled housing.

That is why, in the exemplary embodiment of FIG. 3, a thermal connection is not established by screwing the circuit board 1 in place, instead it is established by clamping or pressing the circuit board 1 in place.

In this variant, a housing cover 11 for clamping or pressing circuit board 1 may contribute to the heat dissipation itself or merely assume a mechanical function. The term heat dissipation is equivalent to the absorption of heat 5, i.e., thermal energy from the circuit board 1.

In FIG. 3, the elevation 10 is connected with housing 6 of the electric refrigerant compressor 7. The circuit board 1 is placed on the elevation 10. To fasten the circuit board 1 in this position, the housing cover 11 and a clamp 12 are provided. The housing cover 11 is held, e.g., by a not shown means for fastening the housing cover 11 to the housing 6.

It is advantageous that the clamp 12 has properties such as being electrically non-conductive and mechanically resilient.

The clamp 12 is introduced between the housing cover 11 and the circuit board 1, such that the pressure of the clamp 12 on the circuit board 1 causes the latter to be firmly clamped onto the elevation 10. Being held in place like this means that the heat 5 from the circuit board 1, including the areas of the conductor paths 3, can be well extracted.

It is advantageous to implement the housing cover 11 as a second housing separable from the first housing part 6, or at least in the form of a bracket.

By omitting the screws 9 and the holes needed for these screws, the second conductor paths 3 may be implemented wider in FIG. 3. In a particular variant, the second conductor paths 3 are arranged offset from one another in different planes within circuit board 1, allowing for the cross-sections of conductor paths 3 to be enlarged.

REFERENCE NUMERAL LIST

1 Circuit board, circuit card
2 First conductor path/track
3 Second conductor path/track
4 Busbar, conductor track
5 Heat emission, heat
6 Cryogenic device housing
7 Refrigerant compressor, cryogenic device
8 Coolant
9 Screws
10 Elevation
11 Housing cover, cover, bracket
12 Clamp

What is claimed is:

1. An assembly for maximizing a current-carrying capacity of conductor tracks comprising:
 a circuit board;
 a plurality of conductor tracks arranged on or within the circuit board;
 a refrigerant compressor having a housing and a coolant, a part of the housing configured to be cooled by the coolant; and
 an elevation directly coupled to the circuit board and directly coupled to the part of the housing configured to be cooled by the coolant, the elevation thereby thermally coupling the circuit board and the part of the housing configured to be cooled by the coolant and maximizing the current-carrying capacity of the plurality of conductor tracks, wherein the elevation directly contacts a portion of the circuit board where the plurality of conductor tracks are located, and wherein the elevation is directly coupled to the circuit board using screws disposed between adjacent ones of the plurality of conductor tracks.

2. The assembly according to claim 1, further comprising a housing cover and a clamp, wherein the housing cover presses the clamp against one side of the circuit board causing another side of the circuit board to be pressed against the elevation to directly couple the elevation to the circuit board.

3. The assembly according to claim 2, wherein the clamp is non-conductive and mechanically resilient.

4. The assembly according to claim 3, wherein the elevation is arranged along a contour of the plurality of conductor tracks and the elevation is electrically insulated from the conductor tracks.

\* \* \* \* \*